United States Patent
Maeda et al.

(10) Patent No.: US 9,434,555 B2
(45) Date of Patent: Sep. 6, 2016

(54) PART INSPECTION APPARATUS AND HANDLER

(71) Applicant: Seiko Epson Corporation, Tokyo (JP)

(72) Inventors: Masami Maeda, Suwa (JP); Toshioki Shimojima, Suwa (JP)

(73) Assignee: Seiko Epson Corporation (JP)

( * ) Notice: Subject to any disclaimer, the term of this patent is extended or adjusted under 35 U.S.C. 154(b) by 326 days.

(21) Appl. No.: 13/765,114

(22) Filed: Feb. 12, 2013

(65) Prior Publication Data

US 2013/0209199 A1  Aug. 15, 2013

(30) Foreign Application Priority Data

Feb. 14, 2012 (JP) .................. 2012-029764

(51) Int. Cl.
| | |
|---|---|
| *G01R 31/28* | (2006.01) |
| *B65G 49/00* | (2006.01) |
| *H01L 21/67* | (2006.01) |
| *H01L 21/683* | (2006.01) |

(52) U.S. Cl.
CPC ........... *B65G 49/00* (2013.01); *G01R 31/2893* (2013.01); *H01L 21/67109* (2013.01); *H01L 21/6838* (2013.01)

(58) Field of Classification Search
None
See application file for complete search history.

(56) References Cited

U.S. PATENT DOCUMENTS

| | | | |
|---|---|---|---|
| 6,104,204 A | | 8/2000 | Hayama et al. |
| 6,169,409 B1 * | | 1/2001 | Amemiya ................ 324/750.08 |
| 7,750,654 B2 * | | 7/2010 | Okumura et al. ....... 324/750.08 |
| 2006/0255821 A1 * | | 11/2006 | Goto ............................ 324/760 |
| 2006/0255822 A1 * | | 11/2006 | Saito et al. ................... 324/760 |
| 2008/0240891 A1 * | | 10/2008 | Obikane ........... H01L 21/67778 414/222.13 |

FOREIGN PATENT DOCUMENTS

| | | |
|---|---|---|
| JP | 2003-121340 | 4/2003 |
| JP | 2004-347329 | 12/2004 |
| JP | 2008-251678 A | 10/2008 |
| TW | 362155 | 6/1999 |

* cited by examiner

*Primary Examiner* — Robert R Raevis
(74) *Attorney, Agent, or Firm* — Harness, Dickey & Pierce, P.L.C.

(57) ABSTRACT

A handler includes a supply shuttle plate on which a device is placed and cooled, and a transfer robot configured to transfer the device placed on the supply shuttle plate from the supply shuttle plate. The transfer robot includes an adsorbing portion configured to adsorb the device placed on the supply shuttle plate thereon, a vertical movement arm configured to move the adsorbing portion away from the supply shuttle plate, an arm box configured to accommodate the adsorbing portion together with the device in a state of being kept away from the supply shuttle plate, and a dry air supply unit configured to supply dry gas into the arm box.

8 Claims, 6 Drawing Sheets

PART INSPECTION APPARATUS AND HANDLER

BACKGROUND

1. Technical Field

The present invention relates to a part inspection apparatus and a handler.

2. Related Art

In the related art, a part inspection apparatus configured to transfer devices as an object to be transferred by a handler is widely used for an inspection of electric characteristics with respect to various devices such as semiconductor devices. In the part inspection apparatus, inspection of the devices is performed at temperatures suitable for usage environments of the respective devices, for example, the inspection may often be performed at a low temperature environment such as 0° or below. The part inspection apparatus which performs the inspection under the low temperature environment includes, for example, a constant temperature reservoir configured to cool the devices and a tester configured to perform the inspection while cooling the devices mounted thereon as described in JP-A-2004-347329. Then, in the part inspection apparatus, the devices cooled to a predetermined temperature in the constant temperature reservoir are transferred to the tester, where the inspection at a low temperature is performed.

Incidentally, since the part inspection apparatus is generally installed in an environment maintained at a constant temperature, a temperature difference between the surfaces of the devices and the outside air is created and dew condensation occurs on the surfaces of the devices when the devices taken out from the constant temperature reservoir are transferred to the tester. Therefore, in the part inspection apparatus described in JP-A-2004-347329, a chamber configured to accommodate the constant temperature reservoir, the tester, and a device transfer space is formed for avoiding dew condensation on the surfaces of the devices. Then, air dried to an extent which does not cause dew condensation due to the above-described temperature difference is supplied to the chamber. Accordingly, dew condensation on the surfaces of the devices may be restrained when the devices are transferred. However, since a supply of dry gas to the above-described chamber is required, the amount of consumption of the dry gas is inevitably increased.

SUMMARY

An advantage of some aspects of the invention is that a part inspection apparatus configured to restrain occurrence of dew condensation on an object to be transferred while reducing the consumed amount of dry gas when the object to be transferred is transferred, and a handler are provided.

One aspect of a part inspection apparatus according to the invention includes: a placing portion on which an object to be transferred is placed and on which the object to be transferred is cooled; a transfer robot configured to transfer the object to be transferred placed on the placing portion from the placing portion; and a tester configured to inspect the object to be transferred, wherein the transfer robot includes: a holding portion configured to hold the object to be transferred placed on the placing portion; an arm configured to move the holding portion away from the placing portion; a housing member configured to accommodate the holding portion together with the object to be transferred in a state of being kept away from the placing portion; and a dry gas supply unit configured to supply dry gas into the housing member.

One aspect of a handler according to the invention includes: a placing portion on which an object to be transferred is placed and on which the object to be transferred is cooled; and a transfer robot configured to transfer the object to be transferred placed on the placing portion from the placing portion, wherein the transfer robot includes: a holding portion configured to hold the object to be transferred placed on the placing portion; an arm configured to move the holding portion away from the placing portion; a housing member configured to accommodate the holding portion together with the object to be transferred in a state of being kept away from the placing portion; and a dry gas supply unit configured to supply dry gas into the housing member.

According to the configurations of the one aspect of the part inspection apparatus and the one aspect of the handler according to the invention, the transfer robot configured to transfer the object to be transferred cooled on the placing portion includes the housing member configured to accommodate the object to be transferred held on the holding portion, and the dry gas is supplied into the housing member. Therefore, when the object to be transferred is transferred by the transfer robot, the object to be transferred is held in a space to which the dry gas is supplied, so that the object to be transferred is restrained from coming into contact with gas on the outside of the housing member. Therefore, even though the dry gas is not supplied to the entire space where the cooled object to be transferred is transferred, the dew condensation occurring on the surface of the object to be transferred may be restrained when the object to be transferred is transferred.

In another aspect of the part inspection apparatus according to the invention, the housing member is a first housing member, a second housing member as a housing member configured to accommodate the placing portion, and the first housing member and the second housing member are connected.

According to the another aspect of the part inspection apparatus of the invention, since the second housing member configured to accommodate the placing portion and the first housing member configured to accommodate the object to be transferred and the holding portion are connected, the object to be transferred is further restrained from coming into contact with the housing member and the gas on the outside of the housing box. Therefore, the dew condensation occurring on the surface of the object to be transferred is further restrained.

In another aspect of the hander according to the invention, the housing member is a first housing member, the dry gas supply unit is a first dry gas supply unit, a second housing member as a housing member configured to accommodate the placing portion, and a second dry gas supply unit configured to supply dry gas into the second housing member.

According to the another aspect of the handler of the invention, the dry gas is supplied also into the second housing member configured to accommodate the placing portion. Therefore, when the object to be transferred is cooled by the placing portion, the cooled object to be transferred is held in a space to which the dry gas is supplied, so that the object to be transferred hardly comes into contact with gas on the outside of the second housing member. Therefore, since the object to be transferred is held in the space where the dry gas is supplied both at the time of cooling and at the time of transfer, the dew condensation on the surfaces of the object to be transferred hardly occurs.

In still another aspect of the handler according to the invention, the placing portion includes a flow channel where a cooling medium flows, and the second gas supply unit supplies the cooling medium discharged from the flow channel of the placing portion to the second housing member as the dry gas.

According to the still another aspect of the handler of the invention, the second dry gas supply unit supplies the cooling medium discharged from the placing portion to the second housing member, thereby using as the dry gas to be supplied into the second housing member. Therefore, in comparison with a case where the cooling medium used for cooling the object to be transferred on the placing portion and dry gas to be supplied to the second housing member are prepared as different gases, the configuration relating to the supply of gas may be simplified, and simultaneously, both of the cooling of the object to be transferred and the supply of the dry gas to the second housing member may be performed.

In yet another aspect of the handler according to the invention, the second dry gas supply unit includes a dry gas heating unit configured to heat the cooling medium discharged from the flow channel of the placing portion.

According to the yet another aspect of the handler of the invention, since the second dry gas supply unit includes the dry gas heating unit configured to heat the cooling medium, the cooling medium heated by the dry gas heating unit is supplied to the second housing member as the dry gas described above. Accordingly, since the temperature of the gas supplied into the second housing member is further restrained from decreasing to a dew point or below, the dew condensation hardly occurs on the surface of the object to be transferred in the second housing member. In addition, decrease of the temperature of a member which constitutes an outer surface of the second housing member to a dew point of the outside atmosphere of the second housing member or below may easily be restrained, so that dew condensation on the member which constitutes the outer surface of the second housing member can easily be restrained.

In still yet another aspect of the handler according to the invention, the first housing member and the second housing member each include an opening configured to allow passage of the holding portion and the object to be transferred held by the holding portion.

According to the still yet another aspect of the handler of the invention, the first housing member and the second housing member each include an opening configured to allow passage of the holding portion of the transfer robot and the object to be transferred held by the holding portion. Therefore, when the object to be transferred placed on the placing portion is accommodated in the first housing member, the object to be transferred is transferred via the openings formed in the second housing member and the opening formed in the first housing member. Therefore, in comparison with the configuration in which transfer from the placing portion to the first housing member is performed by opening and closing the first housing member or the second housing member by itself, the configurations of the first housing member and the second housing member may further be simplified. In addition, the object to be transferred is further restrained from coming into contact with the gas on the outside of the first housing member and the second housing member, and hence the dew condensation further hardly occurs on the surface of the object to be transferred.

In further another aspect of the handler according to the invention, the opening of the first housing member is a first opening, the opening of the second housing member is a second opening, the first housing member has a first lid member configured to cover the first opening, the second housing member has a second lid member configured to cover the second opening, the first lid member is opened when the holding portion passes through the first opening, and the second lid member is opened when the holding portion passes through the second opening.

According to the further another aspect of the handler of the invention, the first housing member includes the first lid member configured to cover the first opening and the second housing member includes the second lid member configured to cover the second opening portion. Then, the first lid member is opened when the holding portion passes through the first opening, and the second lid member is opened when the holding portion passes through the second opening. Therefore, in comparison with a case where the first housing member and the second housing member each do not have a lid member, gas on the outsides of the first housing member and the second housing member is hardly mixed in the interiors of the first housing member and the second housing member. Therefore, the interiors of the first housing member and the second housing member are easily filled with dry gas, and hence dew condensation hardly occurs on the surfaces of the objects to be transferred accommodated in the first housing member and the second housing member.

In still further another aspect of the handler according to the invention, the housing member is a first housing member, the dry gas supply unit is a first dry gas supply unit, a sensor configured to detect characteristics of gas in the first housing member is provided, and the flow amount of the dry gas supplied from the first dry gas supply unit to the first housing member is changed on the basis of the result of detection of the sensor.

According to the still further another aspect of the handler of the invention, the sensor configured to detect the characteristics of gas in the first housing member, for example, temperature or moisture, is provided. Then, the flow amount of the dry gas supplied from the first dry gas supply unit to the first housing member is changed on the basis of the result of detection of the sensor. Therefore, in comparison with the configuration in which such a sensor is not provided, characteristics in the first housing member at the time of detection by the sensor is reflected on the flow rate of dry gas to be supplied into the first housing member. Therefore, the characteristics of the gas in the first housing member can easily be maintained in predetermined conditions, and hence the interior of the first housing member can easily be maintained in an environment which does not cause dew condensation on the surface of the object to be transferred.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Referring now to FIG. 1 to FIG. 7, a part inspection apparatus and a handler of a first embodiment of the invention will be described below. First of all, a general configuration of the handler and the part inspection apparatus will be described with reference to FIG. 1.

Configurations of Handler and Part Inspection Apparatus

Figure 1:
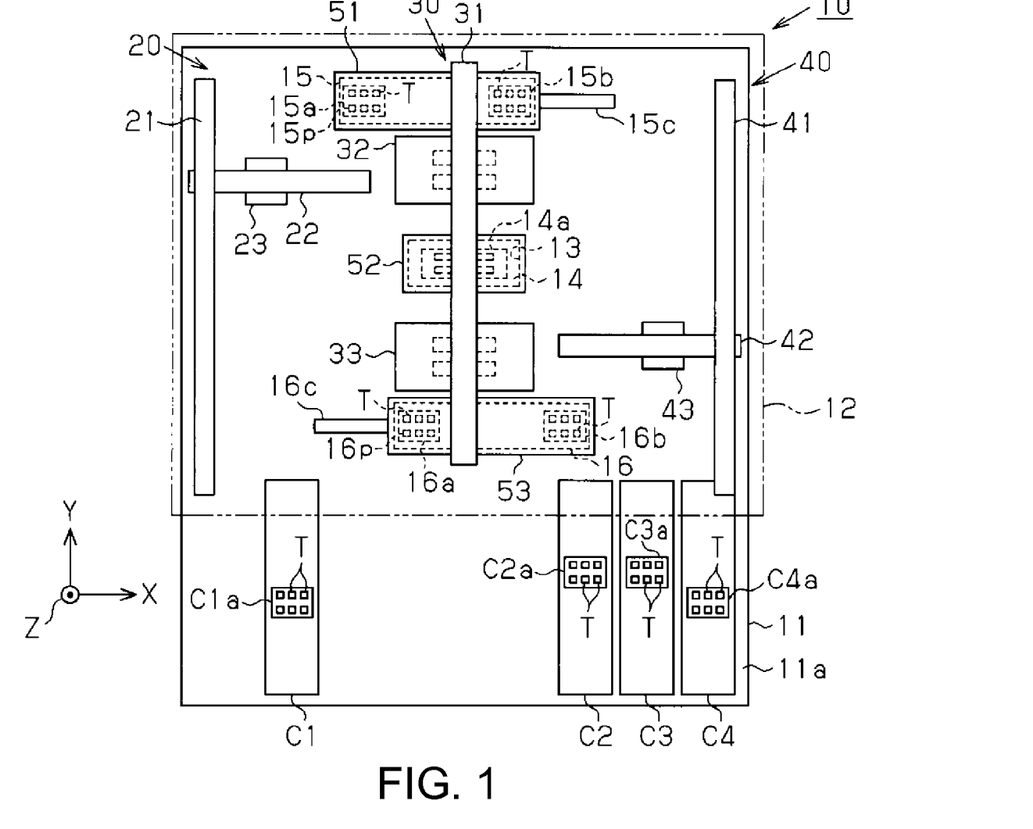
FIG. 1 is a configuration drawing of an apparatus illustrating an arrangement of respective components of a first embodiment in which a part inspection apparatus of the invention is embodied.

As illustrated in FIG. 1, a base 11 of a handler 10 is provided with a mounting surface 11a as an upper surface on which various robots are mounted, and most part of the mounting surface 11a is covered with a cover member 12. Atmospheric air maintained at a normal temperature, for example, at 18° C., is supplied from the outside in a transfer space which is a space surrounded by the mounting surface 11a and the cover member 12.

Four conveyers C1 to C4 configured to transfer devices T as objects to be transferred are arranged on the mounting surface 11a of the base 11 between the outside and the inside of the cover member 12. On one side in an X direction, which is a direction of arrangement of the conveyers C1 to C4, the supply conveyer C1 configured to transfer the devices T before an inspection is disposed from the outside toward the inside of the cover member 12, and the collecting conveyers C2, C3 and C4 configured to transfer the devices T after the inspection are disposed from the inside toward the outside of the cover member 12 are disposed on the other side in the X direction. In these conveyers C1 to C4, a plurality of the devices T are transferred in a state of being accommodated in device trays C1a to C4a on the respective conveyers C1 to C4.

A rectangular-shaped opening 13 penetrating through the mounting surface 11a is formed at a substantially center of the mounting surface 11a which constitutes the transfer space and a test head 14 of a tester configured to inspect electric characteristics of the devices T is mounted in the opening 13. An inspection socket 14a to which the devices T are fitted is mounted on an upper surface of the test head 14, and the test head 14 is electrically connected to an inspection circuit of the tester accommodated in the interior of the base 11.

Then, in a Y direction orthogonal to the X direction of the mounting surface 11a, a first shuttle 15, and a second shuttle 16 on which the devices T before and after the inspection are temporarily placed are disposed so as to face each other with the intermediary of the opening 13. The shuttles 15 and 16 are formed so as to extend in the X direction, and supply shuttle plates 15a and 16a in which the devices T before the inspection is accommodated are fixed respectively on an upper surfaces of the shuttles 15 and 16 on the side of the supply conveyer C1. On the other hand, on the upper surfaces of the shuttles 15 and 16 on the side of the collecting conveyers C2 to C4, collecting shuttle plates 15b and 16b in which the devices T after the inspection are accommodated are fixed respectively. A plurality of device pockets 15p and 16p in which the devices T are accommodated are formed on respective upper surfaces of the supply shuttle plates 15a and 16a and the collecting shuttle plates 15b and 16b. Then, the shuttles 15 and 16 are coupled to shuttle guides 15c and 16c extending in the X direction fixed on the mounting surface 11a, and perform an outward motion and a homeward motion along the X direction. The inspection socket 14a, the shuttle plates 15a, 15b, 16a, and 16b constitute a placing portion.

A robot mechanism configured to transfer the devices T to the inspection socket 14a, the supply shuttle plates 15a and 16a, and the collecting shuttle plates 15b and 16b is mounted on the mounting surface 11a of the base 11. The shuttles 15 and 16 described above move along the shuttle guides 15c and 16c to coincide with actions of a supply robot 20, a transfer robot 30, and a collecting robot 40 which constitute the robot mechanism.

The supply robot 20 is a robot configured to transfer the devices T before the inspection from the device tray C1a on the supply conveyer C1 to the supply shuttle plates 15a and 16a on the shuttles 15 and 16, and is arranged in the Y direction of the supply conveyer C1. Specifically, the supply robot 20 includes a supply side fixing guide 21 as a fixed shaft extending in the Y direction, a supply side movable guide 22 coupled to the supply side fixing guide 21 so as to be capable of performing an outward motion and a homeward motion in the Y direction, and a supply hand unit 23 coupled to the supply side movable guide 22 so as to be capable of performing an outward motion and a homeward motion in the X direction. The supply hand unit 23 has an adsorbing portion configured to adsorb the devices T thereon at a lower end thereof, and is coupled to the supply side movable guide 22 so as to be capable of moving downward and upward with respect to the mounting surface 11a. Then, by the movement of the supply side movable guide 22 and the supply hand unit 23, the devices T placed on the device tray C1a are transferred in a state of being adsorbed on the adsorbing portion of the supply hand unit 23, and is placed on the supply shuttle plates 15a and 16a.

The collecting robot 40 is a robot configured to transfer the devices T after the inspection from the collecting shuttle plates 15b and 16b on the shuttles 15 and 16 to the device trays C2a to C4a on the collecting conveyers C2 to C4, and is arranged in the Y direction of the collecting conveyers C2 to C4. Specifically, in the same manner as the supply robot described above, the collecting robot 40 includes a collecting side fixing guide 41 as a fixed shaft extending in the Y direction, a collecting side movable guide 42 coupled to the collecting side fixing guide 41 so as to be capable of performing an outward motion and a homeward motion in Y direction, and a collecting hand unit 43 coupled to the collecting side movable guide 42 so as to be capable of performing an outward motion and a homeward motion in the X direction. The collecting hand unit 43 has an adsorbing portion configured to adsorb the devices T thereon at a lower end thereof, and is coupled to the collecting side movable guide 42 so as to be capable of moving downward and upward with respect to the mounting surface 11a. Then, by the movement of the collecting side movable guide 42 and the collecting hand unit 43, the devices T placed on the collecting shuttle plates 15b and 16b are adsorbed on the adsorbing portion of the collecting hand unit 43 and are transferred, and are placed on the device trays C2a to C4a.

The transfer robot 30 includes a transferring guide 31 as a fixed shaft extending in the Y direction placed at a substantially center of the transfer space, a first transferring unit 32 coupled to the transferring guide 31 so as to be capable of performing an outward motion and a homeward motion in the Y direction, and a second transferring unit 33 coupled also to the transferring guide 31 so as to be capable of performing an outward motion and a homeward motion in the Y direction. From among these members, the first transfer unit 32 reciprocates between the top of the first shuttle 15 and the top of the test head 14, and the second transferring unit 33 reciprocates between the top of the second shuttle 16 and the top of the test head 14. The first transferring unit 32 and the second transferring unit 33 have adsorbing portions respectively configured to adsorb the devices T thereon at lower ends thereof, and are coupled to the transferring guide 31 so as to be capable of moving downward and upward with respect to the mounting surface 11a.

Then, the first transferring unit 32 transfers the devices T before the inspection placed on the supply shuttle plate 15a on the first shuttle 15 and adsorbed on the absorption portion, and fits the devices T into the inspection socket 14a of the test head 14 at a predetermined pressing force. A plurality of depressed female terminals which allow male terminals of the devices T to be fitted thereto are formed on a bottom surface of the inspection socket 14a, and fitting of the male terminals of the devices T into the female terminals of the inspection socket 14a allows the tester to inspect electric characteristics of the devices T. The tester starts inspection of the devices T upon reception of a command to start an inspection from the handler 10, and outputs a signal which indicates termination of the inspection to the handler 10 together with the result of inspection. When the inspection of the devices T terminates, the first transferring unit 32 transfers the devices T after the inspection from the inspection socket 14a of the test head 14 to the collecting shuttle plate 15b on the first shuttle 15.

In the same manner, the second transferring unit 33 transfers the devices T before the inspection placed on the supply shuttle plate 16a on the second shuttle 16 and adsorbed on the absorption portion, and fits the devices T into the inspection socket 14a of the test head 14 at a predetermined pressing force. When the inspection of the devices T by the tester terminates, the second transferring unit 33 transfers the devices T after the inspection from the inspection socket 14a of the test head 14 to the collecting shuttle plate 16b on the second shuttle 16. Such transfer of the devices T to the test head 14 is performed alternately by the first transferring unit 32 and the second transferring unit 33, the devices T transferred to the test head 14 are inspected by the tester in sequence.

The supply hand unit 23, the collecting hand unit 43, the first transferring unit 32, and the second transferring unit 33 are configured to hold the plurality of devices T by absorption at the same time, and the respective absorption portions are, for example, end effectors configured to adsorb the devices T thereon by, for example, vacuum contact.

In this embodiment, a first housing box 51 configured to accommodate the first shuttle 15, the supply shuttle plate 15a and the collecting shuttle plate 15b is disposed in the periphery of the first shuttle 15. In the same manner, an inspection box 52 configured to accommodate the test head 14 and the inspection socket 14a is disposed in the periphery of the opening 13 and the test head 14 mounted on the opening 13. In addition, a second housing box 53 configured to accommodate the second shuttle 16, the supplying shuttle plate 16a, and the collecting shuttle plate 16b is disposed in the periphery of the second shuttle 16. The first housing box 51 performs an outward motion and a homeward motion together with the first shuttle 15 in the X-direction, and the second housing box 53 performs an outward motion and a homeward motion in the X direction together with the second shuttle 16. In the first housing box 51, the inspection box 52, and the second housing box 53 which constitute second housing members, respective members and the devices T which are accommodated in the respective boxes 51 to 53 are cooled.

Configuration of Cooling Unit

Figure 2:
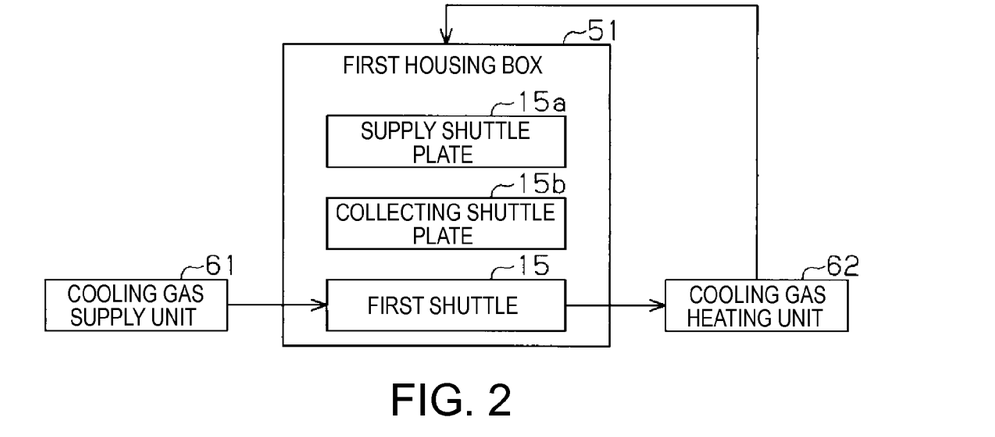
FIG. 2 is a system drawing illustrating a flow channel system of a cooling unit including a handler of the first embodiment.

Referring now to FIG. 2, cooling units configured to cool the respective members and the devices T described above will be described. The cooling units configured to perform cooling respectively in the first housing box 51, the inspection box 52, and the second housing box 53 described above have the same configuration in flow channel systems for a cooling medium that cools objects to be cooled although the positions where the respective cooling units are mounted and the objects to be cooled are different. Therefore, only the cooling unit of the first housing box 51 will be described below.

A flow channel in which cooling gas as a cooling medium flows is formed in the interior of the first shuttle 15 disposed in the first housing box 51, and a cooling gas supply unit 61 is connected to an inlet port of the flow channel as illustrated in FIG. 2. The cooling gas supply unit 61 includes, for example, a storage tank for liquid nitrogen, a flow rate control valve, and a carburetor, and is configured to supply nitrogen gas at temperatures of 0° C. or below generated by gasification of the liquid nitrogen, for example, at a temperature of −45° C. to the flow channel in the first shuttle 15. The temperature of the nitrogen gas supplied from the cooling gas supply unit 61 is lower than the environmental temperature in which the nitrogen gas is supplied.

When the nitrogen gas is supplied from the cooling gas supply unit 61 to the flow channel in the first shuttle 15, the first shuttle 15 is cooled, and subsequently, the supply shuttle plate 15a and the collecting shuttle plate 15b are cooled via the first shuttle 15.

A cooling gas heating unit 62 as a dry gas heating unit configured to heat cooling gas passed through the interior of the first shuttle 15 is connected to an outlet port of the flow channel formed in the first shuttle 15, and the first housing box 51 is connected to an outlet port of the cooling gas heating unit 62. The cooling gas heating unit 62 is, for example, a heat exchanger configured to perform heat exchange with gas at a temperature higher than cooling gas, and is configured to heat cooling gas discharged from a flow channel in the first shuttle 15 to, for example, a normal temperature, and supply the heated cooling gas to the interior of the first housing box 51.

Accordingly, since the temperature of the gas supplied into the first housing box 51 is further restrained from decreasing to a dew point or below, dew condensation hardly occurs on the surfaces of the devices T accommodated in the first housing box 51. Furthermore, decrease of the temperature of a member which constitutes an outer surface of the first housing box 51 to a dew point of the outside air of the first housing box 51 or below may easily be restrained, so that dew condensation on the member which constitutes the outer surface of the first housing box 51 can easily be restrained. In addition, the cooling gas heating unit 62 heats the cooling gas to a temperature of the dew point of the outside air of the first housing box 51 or higher. Therefore, probability of occurrence of dew condensation on the devices T in the first housing box 51 and the member which constitutes the outside surface of the first housing box 51 is further reduced.

In this manner, in this embodiment, the first shuttle 15, the shuttle plates 15a and 15b, the cooling gas supply unit 61, and the cooling gas heating unit 62 constitute the cooling unit. Then, the cooling gas supply unit 61 and the cooling gas heating unit 62 constitute a second dry gas supply unit.

Configuration of Transfer Robot and Housing Box

Figure 3:
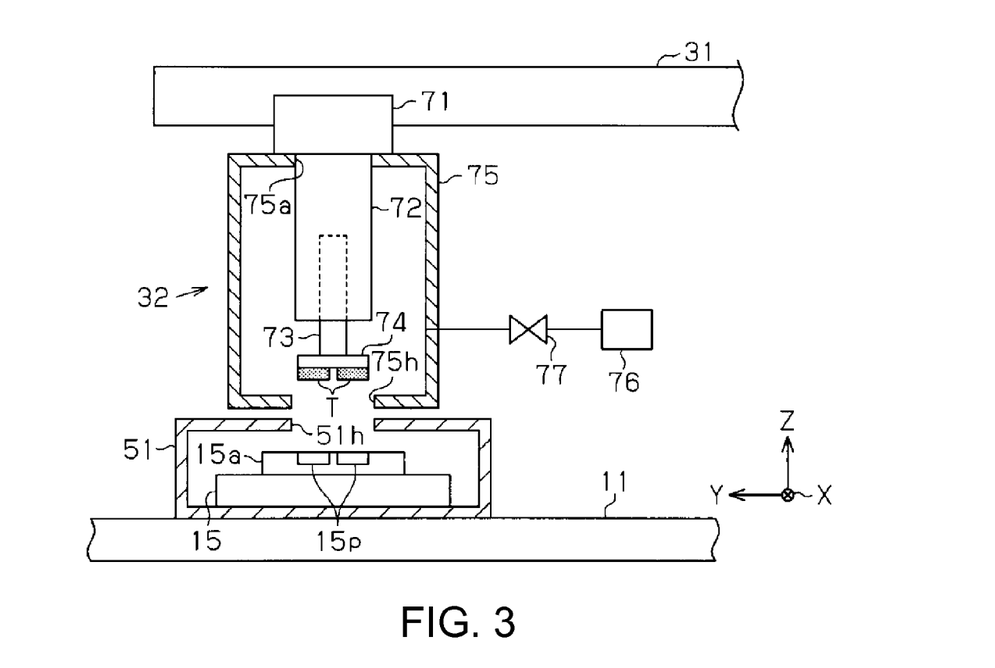
FIG. 3 is a configuration drawing illustrating partial configurations of a transfer robot and a first shuttle of the handler of the first embodiment.

The configuration of the above-described transfer robot 30, in particular, the configurations of the transfer units 32 and 33 of the transfer robot 30 and the boxes 51 to 53 will be described with reference to FIG. 3. In FIG. 3, a state in which the first transfer unit 32 is positioned immediately above the supply shuttle plate 15a of the first shuttle 15 by the movement of the first shuttle 15 in the X-direction and the movement of the first transfer unit 32 in the Y-direction is shown.

Although the positions of arrangement and the devices T to be transferred are different between the first transfer unit 32 and the second transfer unit 33, the configuration for transferring the devices T is the same, and hence only the first transfer unit 32 will be described below. Although the positions of arrangement are different between the first housing box 51 and the second housing box 53, the configuration for accommodating the devices T mounted therein is the same. Therefore, only the first housing box 51 will be described below. In addition, although the positions of arrangement and the members accommodated in the box are different between the first housing box 51 and the inspection box 52, a point that the devices T are accommodated in spaces surrounded by the boxes is common. Therefore, the description of the inspection box 52 is replaced by the description of the first housing box 51.

As illustrated in FIG. 3, the first housing box 51 has a box shape that accommodates the first shuttle 15 and the supply shuttle plate 15a in the interior thereof. An upper surface of the first housing box 51 facing the first transfer unit 32 is formed with a rectangular-shaped opening 51h as a second opening which allows passage of the devices T immediately above the device pocket 15p.

The first transfer unit 32 includes a horizontal moving arm 71 connected to the transfer guide 31 so as to be capable of performing an outward motion and a homeward motion in the Y direction, a supporting portion 72 fixed to the horizontal moving arm 71, and a vertical movement arm 73 connected to the supporting portion 72 so as to be capable of performing a relative movement and configured to serve as an arm moving downward and upward in the Z direction orthogonal to the Y direction. In addition, the first transfer unit 32 includes an adsorbing portion 74 as a holding portion connected to a lower end of the vertical movement arm 73 and an arm box 75 fixed to the horizontal moving arm 71, for example, as a box-shaped first housing member. The vertical movement arm 73 moves toward the shuttle plates 15a and 15b by the downward movement, and moves away from the shuttle plates 15a and 15b by the upward movement.

An upper surface of the arm box 75 is formed with a cylindrical-shaped insertion hole 75a which allows insertion of the cylindrical supporting portion 72, and a sealing member seals between an outer peripheral surface of the supporting portion 72 and an inner peripheral surface of the insertion hole 75a. A lower surface of the arm box 75 facing the base 11 is formed with a rectangular-shaped opening 75h as a first opening which allows passage of the adsorbing portion 74 on which the device T is adsorbed or is not adsorbed. Although the opening 51h of the first housing box 51 and the opening 75h of the arm box 75 described above have substantially the same shape, these openings do not have to be the same shape as long as the size is sufficient to allow passage of the adsorbing portion 74 on which the device T is adsorbed or is not adsorbed.

The length of the arm box 75 in a Z-direction is a length which allows accommodation of the supporting portion 72, the vertical movement arm 73 at the highest transfer position, the adsorbing portion 74, and the devices T in the interior thereof. The length of the arm box 75 in the Z-direction is a length which forms a gap between the lower surface of the arm box 75 and the upper surface of the first housing box 51 when the first transfer unit 32 is positioned immediately above the first housing box 51.

Dry air is supplied to the first housing box 51 and the arm box 75, and the interiors of the box 51 and 75 are in a state of positive pressure with respect to the outsides of the box 51 and 75. Therefore, dry air flows out from the opening 51h of the first housing box 51 and the opening 75h of the arm box 75. Therefore, when the outside air enters the first housing box 51 from the opening 51h, entry of the outside air into the arm box 75 from the opening 75h is restrained.

The gap formed between the lower surface of the arm box 75 and the upper surface of the first housing box 51 has a magnitude which is filled with the dry air flowing out from the openings 75h and 51h when the opening 75h and the opening 51h are arranged so as to face each other. Therefore, when the devices T are handed from the first housing box 51 to the arm box 75 or from the arm box 75 to the first housing box 51, the above-described gap is filled with the dry air.

Accordingly, the devices T positioned in the gap between the arm box 75 and the first housing box 51 are restrained from coming into contact with the outside air.

For reference, the arm box 75 accommodates the supporting portion 72, the vertical movement arm 73, the adsorbing portion 74, and the devices T when the position of the vertical movement arm 73 is between the transfer position and a accommodated position which is a position lowered from the transfer position by a predetermined distance.

A dry air supply unit 76 as a first dry gas supply unit configured to supply dry air to the interior of the arm box 75 is connected to the arm box 75 via an air valve 77 configured to adjust the flow rate of the dry air. The dry air supply unit 76 includes a compressor and a dryer, and is configured to supply compressed air adjusted in amount of water content into the arm box 75. The dew point of the compressed air supplied from the dry air supply unit 76 is lower than the lowest temperature that the devices T reach in the respective boxes.

Electric Configuration of Part Inspection Apparatus

Figure 4:
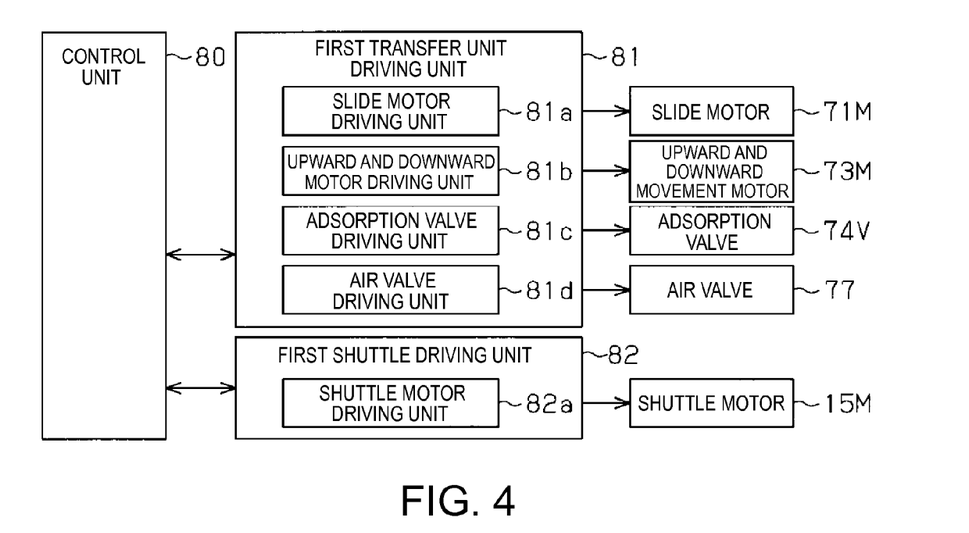
FIG. 4 is an electrical block diagram illustrating an electric configuration of the handler of the first embodiment.

Referring now to FIG. 4, an electric configuration of the part inspection apparatus will be described. In the following description, the electric configurations relating to the actions of the transfer units 32 and 33 and the shuttles 15 and 16 mounted on the handler 10 which constitute the part inspection apparatus will be described, and description of other electric configurations will be omitted. As regards the electric configurations relating to the respective actions of the transfer units 32 and 33, functions of the respective components are the same although objects to be controlled are different. Therefore, description of the electric configuration relating to the action of the first transfer unit 32 will be given, and description of the electric configuration relating to the action of the second transfer unit 33 will be omitted. As regards the electric configurations relating to the respective actions of shuttles 15 and 16, functions of the respective components are the same although objects to be controlled are different. Therefore, description of the electric configuration relating to the action of the first shuttle 15 will be given, and description of the electric configuration relating to the action of second shuttle 16 will be omitted.

As illustrated in FIG. 4, a control unit 80 configured to control actions of the respective robots 20, 30, and 40 which constitute the above-described robot mechanism and actions of the respective conveyers C1 to C4 is mounted on the part inspection apparatus. The control unit 80 is composed mainly of a micro computer having a Central Processing Unit (CPU), a nonvolatile memory (ROM), and a volatile memory (RAM).

A first transferring unit driving unit 81 configured to drive the first transfer unit 32 is connected to the control unit 80, and the first transferring unit driving unit 81 includes a slide motor driving unit 81a, an upward and downward motor driving unit 81b, an adsorption valve driving unit 81c, and an air valve driving unit 81d.

The slide motor driving unit 81a among the above-described members generates a drive current on the basis of a drive command input from the control unit 80, and outputs the generated drive current to a slide motor 71M. The slide motor 71M rotates in the forward or reverse direction according to the input drive current, whereby the horizontal moving arm 71 performs an outward motion or a homeward motion in the Y-direction. The upward and downward motor driving unit 81b generates a drive current on the basis of a drive command input from the control unit 80, and outputs the generated drive current to an upward and downward movement motor 73M. The upward and downward movement motor 73M rotates in the forward or reverse direction according to the input drive current, whereby the vertical movement arm 73 moves downward or upward in the Z-direction.

The adsorption valve driving unit 81c generates a drive voltage on the basis of an opening-and-closing command input from the control unit 80, and outputs the generated drive voltage to an adsorption valve 74V which controls the adsorption action of the adsorbing portion 74 configured to adsorb the devices T thereon. The adsorption valve 74V opens to start adsorption of the devices T or closes to terminate the adsorption of the devices T depending on the drive voltage input thereto.

The air valve driving unit 81d generates a drive voltage on the basis of the opening-and-closing command input from the control unit 80, and outputs the generated drive voltage to the above-described air valve 77. The air valve 77 opens to start a supply of dry air into the arm box 75 or closes to terminate a supply of the dry air into the arm box 75 depending on the drive voltage input thereto.

A first shuttle driving unit 82 configured to drive the first shuttle 15 is connected to the control unit 80, and the first shuttle driving unit 82 includes a shuttle motor driving unit 82a. The shuttle motor driving unit 82a generates a drive current on the basis of a drive command input from the control unit 80, and outputs the generated drive current to a shuttle motor 15M. The shuttle motor 15M rotates in the forward or reverse direction according to the input drive current, whereby the first shuttle 15 performs an outward motion or a homeward motion in the X-direction.

Action to Transfer Handler and Part Inspection Apparatus

Figure 5:
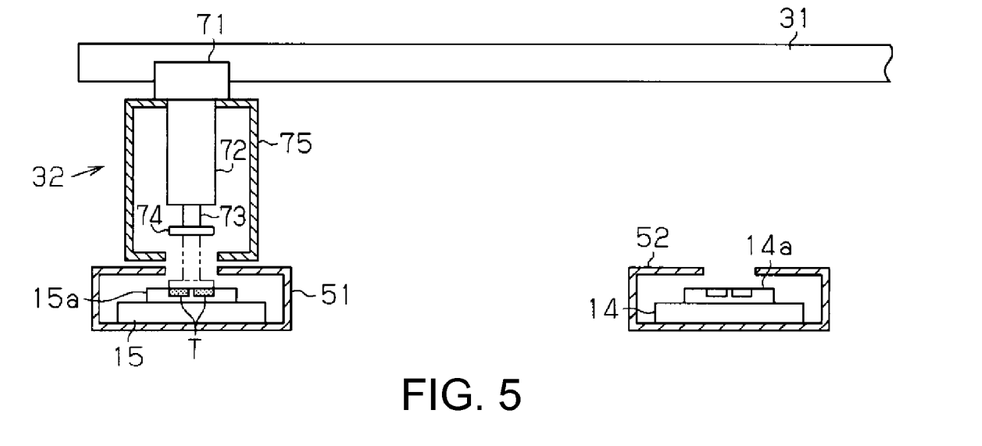
FIG. 5 is an action drawing illustrating a state of transfer of a device by the handler of the first embodiment.
Figure 6:
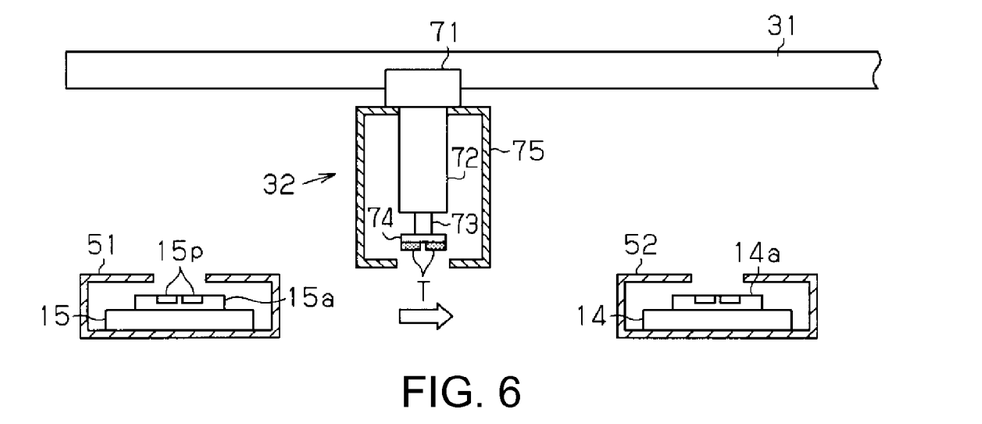
FIG. 6 is an action drawing illustrating the state of transfer of the device by the handler of the first embodiment.

An action to be performed when the first transfer unit 32 including the handler and the part inspection apparatus transfers the devices T accommodated in the supply shuttle plate 15a of the first shuttle 15 to the test head 14 will be described with reference to FIG. 5 to FIG. 7. Although the routes of transfer are different, the action to be performed when the first transfer unit 32 transfers the devices T accommodated in the test head 14 to the collecting shuttle plate 15b is almost the same as actions described below in terms of the direction of action and the sequence of actions of the respective parts relating to the transfer of the devices T. Therefore, description thereof will be omitted. Although the members relating to the transfer and the routes of transfer are different, the actions performed when the second transfer unit 33 transfers the devices T between the supplying shuttle plate 16a, the collecting shuttle plate 16b of the second shuttle 16 and the test head 14 are almost the same as the actions described below in terms of the direction of action and the sequence of actions of the respective portions relating to the transfer of the devices T. Therefore, description thereof will be omitted.

First of all, nitrogen gas is supplied from the cooling gas supply unit 61 to the flow channel in the first shuttle 15, and the supply shuttle plate 15a and the collecting shuttle plate 15b are cooled via the first shuttle 15. Also, the cooling gas discharged from the flow channel in the first shuttle 15 is heated to a normal temperature by the cooling gas heating unit 62, and the heated cooling gas is supplied into the first housing box 51. Then, in the same manner as the first shuttle 15, nitrogen gas is supplied from the cooling gas supply unit into the flow channel in the test head 14, and the inspection socket 14a is cooled via the test head 14. Also, the cooling gas discharged from the flow channel in the test head 14 is heated to a normal temperature by the cooling gas heating unit, and the heated cooling gas is supplied into the inspection box 52.

When the devices T are transferred from the supply shuttle plate 15a of the first shuttle 15 to the test head 14 from this state, first of all, the control unit 80 outputs an valve-open command to the air valve driving unit 81d, opens the air valve 77 by the air valve driving unit 81d to start a supply of dry air into the arm box 75.

Subsequently, the control unit 80 outputs a drive signal for driving the shuttle motor 15M to the shuttle motor driving unit 82a, and drives the shuttle motor 15M by the shuttle motor driving unit 82a to arrange the supply shuttle plate 15a on the first shuttle 15 immediately below the transfer guide 31.

Subsequently, the control unit 80 outputs a drive signal for driving the slide motor 71M to the slide motor driving unit 81a, and drives the slide motor 71M by the slide motor driving unit 81a to move the horizontal moving arm 71 in the Y direction. Accordingly, as illustrated in FIG. 5, the first transfer unit 32 is arranged immediately above the supply shuttle plate 15a of the first shuttle 15, and the opening 75h of the arm box 75 and the opening 51h of the first housing box 51 face each other.

When the opening 75h and the opening 51h face each other, the control unit 80 outputs a drive signal for driving the upward and downward movement motor 73M to the upward and downward motor driving unit 81b, and drives the upward and downward movement motor 73M by the upward and downward motor driving unit 81b to move the vertical movement arm 73 downward. Accordingly, the devices T cooled by the supply shuttle plate 15a and the adsorbing portions 74 come into contact with each other. Then, the control unit 80 outputs a drive signal for opening the adsorption valve 74V to the adsorption valve driving unit 81c, and opens the adsorption valve 74V by the adsorption valve driving unit 81c to cause the devices T to be adsorbed on the adsorbing portions 74.

Subsequently, the control unit 80 outputs a drive signal for driving the upward and downward movement motor 73M to the upward and downward motor driving unit 81b, and drives the upward and downward movement motor 73M by the upward and downward motor driving unit 81b to move the vertical movement arm 73 upward. Accordingly, the devices T adsorbed on the adsorbing portions 74 are accommodated in the arm box 75.

In this case, the devices T adsorbed on the adsorbing portions 74 come into contact with dry air supplied to the arm box 75 and heated cooling gas supplied to the first housing box 51, while may hardly come into contact with the outside air which is gas on the outside of the arm box 75 and the outside air which is gas on the outside of the first housing box 51. Therefore, even when the dry air is not supplied to the entire space where the cooled devices T are transferred, dew condensation which may occur on the surface of the devices T when the devices T are transferred may be restrained.

The control unit 80 outputs a drive signal for driving the slide motor 71M to the slide motor driving unit 81a, and drives the slide motor 71M by the slide motor driving unit 81a to move the horizontal moving arm 71 in the Y direction. Accordingly, as illustrated in FIG. 6, the first transfer unit 32 moves from immediately above the first shuttle 15 toward immediately above the test head 14 in a state in which the devices T are accommodated in the arm box 75.

Figure 7:
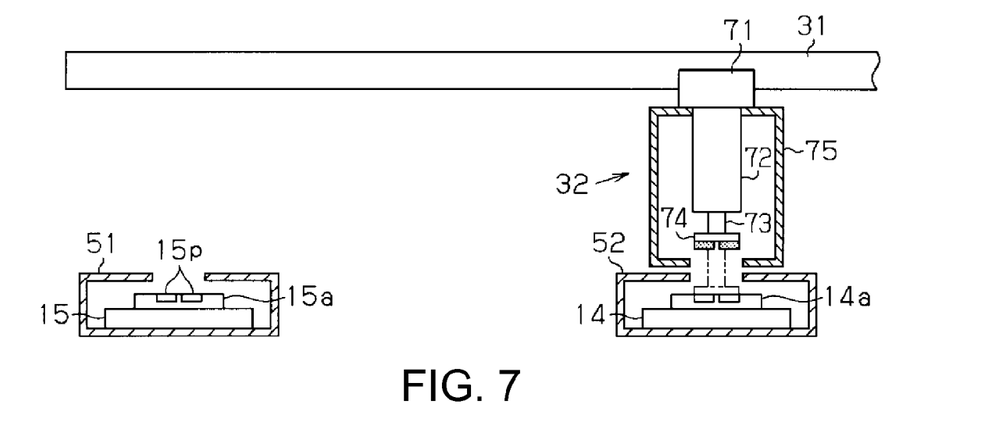
FIG. 7 is an action drawing illustrating the state of transfer of the device by the handler of the first embodiment.

As illustrated in FIG. 7, when the first transfer unit 32 is positioned at immediately above the test head 14, and the opening 75h of the arm box 75 and an opening of the inspection box 52 face each other, the control unit 80 outputs a drive signal for driving the upward and downward movement motor 73M to the upward and downward motor driving unit 81b, and drives the upward and downward movement motor 73M by the upward and downward motor driving unit 81b to move the vertical movement arm 73 downward. Accordingly, the devices T adsorbed on the adsorbing portions 74 are pressed against the inspection socket 14a of the test head 14 at a predetermined pressing force.

In this case, the devices T adsorbed on the adsorbing portions 74 come into contact with dry air supplied to the arm box 75 and heated cooling gas supplied to the inspection box 52, while may hardly come into contact with the gas on the outside of the arm box 75 and the gas on the outside of the inspection box 52. Therefore, even though dry air is not supplied to an entire space where the cooled devices T are transferred, the dew condensation which may occur on the surface of the devices T may be restrained when the devices T are transferred.

Then, when the inspection of the devices T is terminated, the control unit 80 generates and outputs a drive signal for driving the upward and downward movement motor 73M, and the upward and downward motor driving unit 81b drives the upward and downward movement motor 73M on the basis of the generated drive signal. Accordingly, the vertical movement arm 73 moves upward, and the devices T adsorbed on the adsorbing portions 74 are accommodated in the arm box 75.

As described above, according to the part inspection apparatus and the handler of the first embodiment, the effects listed below are achieved.

(1) The transfer robot 30 configured to transfer the cooled devices T by the shuttle plates 15a, 15b, 16a, and 16b and the inspection socket 14a includes the arm box 75 configured to accommodate the devices T held by the adsorbing portions 74 and dry air is supplied to the interior of the arm box 75. Therefore, when the devices T are transferred by the transfer robot 30, the devices T are held in the space where the dry air is supplied, so that gas on the outside of the arm box 75 and the devices T are hardly brought into contact with each other. Therefore, even though dry air is not supplied to an entire space where the cooled devices T are transferred, the dew condensation which may occur on the surfaces of the devices T may be restrained when the devices T are transferred.

(2) Dry air is also supplied to the interiors of the respective boxes 51 to 53. Therefore, when the devices T are cooled by the shuttle plates 15a, 15b, 16a, and 16b and the inspection socket 14a, the devices T being cooled are held in the space where the dry air is supplied, so that the devices T are hardly brought into contact with gas outside of the respective boxes 51 to 53. Therefore, since the devices T are held in the space where the dry air is supplied both at the time of cooling and at the time of transfer, dew condensation on the surfaces of the devices T hardly occurs.

(3) The cooling gas discharged from the shuttle plates 15a, 15b, 16a, and 16b and the inspection socket 14a is supplied to the respective boxes 51 to 53. Accordingly, the cooling gas is used as dry air supplied into the respective boxes 51 to 53. Therefore, in comparison with a case where the cooling gas used for cooling the devices T in the shuttle plates 15a, 15b, 16a, and 16b and the inspection socket 14a and dry air supplied to the respective boxes 51 to 53 are prepared as separate gases, the configuration relating to the supply of gas is simplified.

(4) Since the cooling gas heating unit 62 configured to heat the cooling gas is provided, the cooling gas heated by the cooling gas heating unit 62 is supplied to the respective boxes 51 to 53 as dry air. Accordingly, since the temperature of the dry air supplied into the respective boxes 51 to 53 is restrained from decreasing to a dew point or below, dew condensation hardly occurs on the surfaces of the devices T within the respective boxes 51 to 53. In addition, decrease of the temperature of a member which constitutes the outer surfaces of the respective boxes 51 to 53 to a dew point of the atmosphere on the outside of the respective boxes 51 to 53 or below is restrained, so that dew condensation on the members which constitute the outer surfaces of the respective boxes 51 to 53 hardly occurs.

(5) The arm box 75 and the respective boxes 51 to 53 include openings that allow the adsorbing portions 74 of the transfer robot 30 and the devices T held by the adsorbing portions 74 to pass therethrough. Therefore, when the devices T are accommodated in the arm box 75, the devices T are transferred via openings formed on the respective boxes 51 to 53 and the opening 75h formed on the arm box 75. Therefore, the configuration of the arm box 75 and the respective boxes 51 to 53 may be facilitated further easily in comparison with the configuration in which the transfer from the shuttle plates 15a, 15b, 16a and 16b and the inspection socket 14a to the arm box 75 by opening-and-closing the arm box 75 and the respective boxes 51 to 53 by themselves. In addition, the devices T are further restrained from coming into contact with the gas on the outside of the arm box 75 and the respective boxes 51 to 53 and hence dew condensation may further hardly occur on the surfaces of the devices T.

Second Embodiment

Referring now to FIG. 8 to FIG. 15, apart inspection apparatus and a handler according to a second embodiment of the invention will be described below. For reference, the handler and the part inspection apparatus of the second embodiment are different from the handler and the part inspection apparatus of the first embodiment described above in the configurations of the transfer units 32 and 33 of the transfer robot 30 and the respective boxes 51 to 53. Therefore, the different configurations are described in the following description and description of other configurations is omitted.

Configuration of Transfer Robot and Housing Box

Figure 8:
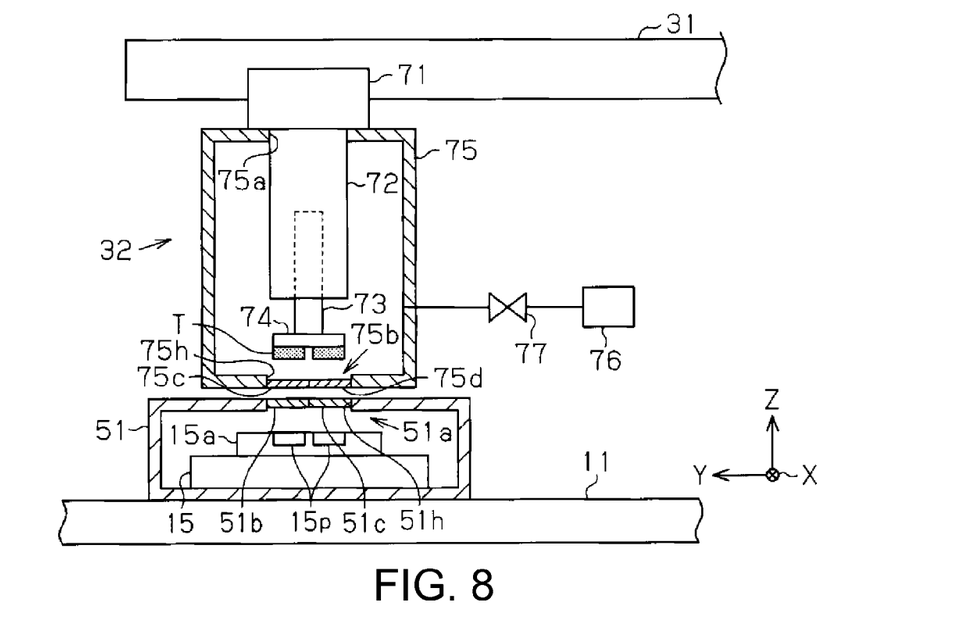
FIG. 8 is a configuration drawing illustrating partial configurations of a transfer robot and a first shuttle according to a second embodiment in which the part inspection apparatus of the invention is embodied.

As illustrated in FIG. 8, the first housing box 51 has a box shape that accommodates the first shuttle 15 and the supply shuttle plate 15a in the interior thereof in the same manner as that of the first embodiment. The rectangular-shaped opening 51h which allows passage of the adsorbing portions 74 of the first transfer unit 32 is provided immediately above the device pocket 15p on the upper surface of the first housing box 51. In addition, the first housing box 51 includes a lid portion 51a as a second lid member configured to cover the opening 51h, and the lid member 51a includes two plate members 51b and 51c having a rectangular shape extending in the X-direction and a box opening-and-closing cylinder, not illustrated, configured to drive the respective plate member 51b and 51c. In this embodiment, the first housing box 51 and the lid member 51a constitute a second housing member.

When an opening pressure for opening the lid member 51a is applied to the box opening-and-closing cylinder, the box opening-and-closing cylinder contracts, and the plate members 51b and 51c are accommodated in the first housing box 51 respectively. In contrast, when a closing pressure for closing the lid member 51a is applied to the box opening-and-closing cylinder, the box opening-and-closing cylinder expands, and hence the plate members 51b and 51c project from the interior of the first housing box 51 toward the opening 51h respectively. Accordingly, projecting ends of the plate members 51b and 51c extending in the X-direction come into contact with each other, and the opening 51h is covered with the plate member 51b and 51c.

The first transfer unit 32 includes the horizontal moving arm 71, the supporting portion 72, the vertical movement arm 73, the adsorbing portions 74, and the arm box 75 in the same manner as the first embodiment described above, and the dry air supply unit 76 is connected to the arm box 75 via the air valve 77.

In addition, the arm box 75 of the first transfer unit 32 includes a lid member 75b as a first lid member configured to cover the above-described opening 75h. The lid member 75b includes two plate members 75c and 75d having a rectangular shape extending in the X-direction and an arm opening-and-closing cylinder, not illustrated, configured to drive the plate members 75c and 75d respectively. In this embodiment, the arm box 75 and the lid member 75b constitute the first housing member.

When an opening pressure for opening the lid member 75b is applied to the arm opening-and-closing cylinder, the arm opening-and-closing cylinder contracts, and the plate members 75c and 75d are accommodated in the arm box 75 respectively. In contrast, when a closing pressure for closing the lid member 75b is applied to the arm opening-and-closing cylinder, the arm opening-and-closing cylinder expands, and the plate members 75c and 75d project from the interior of the arm box 75 toward the opening 75h respectively. Accordingly, projecting ends of the plate members 75c and 75d extending in the X-direction come into contact with each other, and the opening 75h is covered with the plate members 75c and 75d.

Electric Configuration of Part Inspection Apparatus

Figure 9:
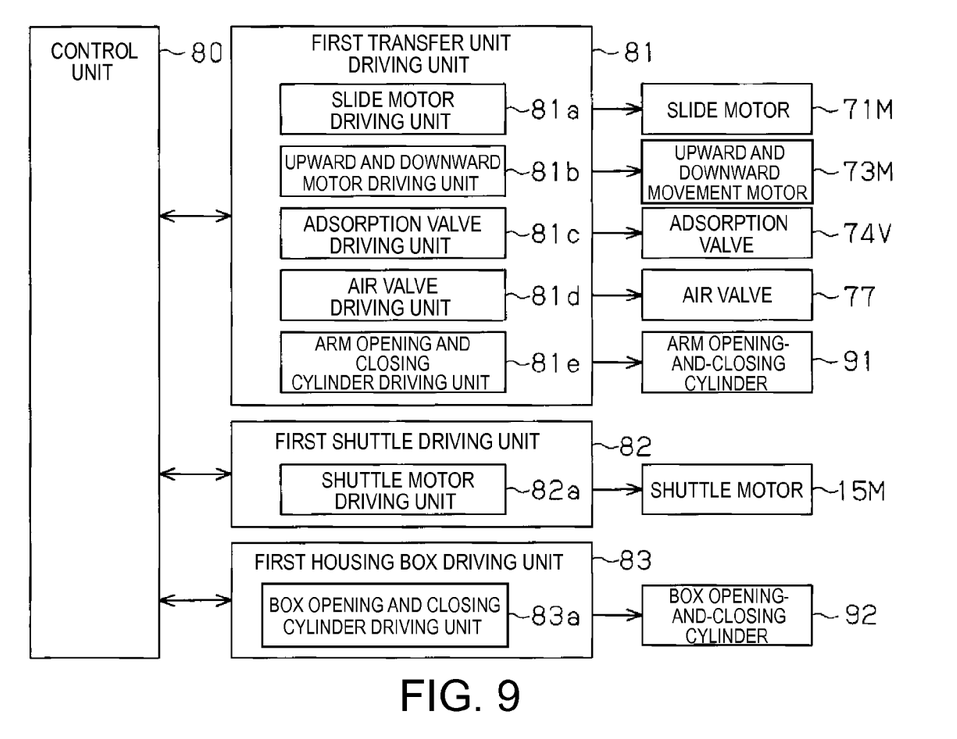
FIG. 9 is an electrical block diagram illustrating an electric configuration of a hander of the second embodiment.

Referring now to FIG. 9, an electric configuration of the part inspection apparatus will be described. The electrical configuration of the second embodiment is different from the electrical configuration of the first embodiment described above in having an electrical configuration for controlling the action of the lid member 75b of the arm box 75 and an electrical configuration for controlling the action of the first housing box 51. Therefore, in the following description, these different points will be described in detail.

As illustrated in FIG. 9, the part inspection apparatus includes the control unit 80 mounted thereon and the first transferring unit driving unit 81 and the first shuttle driving unit 82 are connected to the control unit 80 as in the first embodiment. From among the members described above, the first transferring unit driving unit 81 includes the slide motor driving unit 81a, the upward and downward motor driving unit 81b, the adsorption valve driving unit 81c, the air valve driving unit 81d, and an arm opening-and-closing cylinder driving unit 81e.

The arm opening-and-closing cylinder driving unit 81e generates an opening pressure or a closing pressure, which is a working pressure of an arm opening-and-closing cylinder 91 on the basis of a drive command input from the control unit and outputs the generated pressure to the arm opening-and-closing cylinder 91. The arm opening-and-closing cylinder 91 contracts or expands according to the working pressure input thereto and, whereby the lid member 75b of the arm box 75 is opened or closed.

The first shuttle driving unit 82 includes the shuttle motor driving unit 82a as in the first embodiment.

A first housing box driving unit 83 is connected to the control unit 80, and the first housing box driving unit 83 includes a box opening-and-closing cylinder driving unit 83a. The box opening-and-closing cylinder driving unit 83a generates an opening pressure or a closing pressure, which is a working pressure of a box opening-and-closing cylinder 92 on the basis of a drive command input from the control unit and outputs the generated pressure to the box opening-and-closing cylinder 92. The box opening-and-closing cylinder 92 contracts or expands according to the working pressure input thereto and, whereby the lid member 51a of the first housing box 51 is opened or closed.

Action to Transfer Handler and Part Inspection Apparatus

An action to be performed when the first transfer unit 32 including the handler and the part inspection apparatus transfers the devices T accommodated in the supply shuttle plate 15a of the first shuttle 15 to the test head 14 will be described with reference to FIG. 10 to FIG. 15. The transfer action of the second embodiment is different from the transfer action of the first embodiment described above in that the opening-and-closing of the lid member 75b of the arm box 75 and of the lid member 51a of the first housing box 51 are performed. Therefore, in the following description, these different points will be described in detail.

Figure 10:
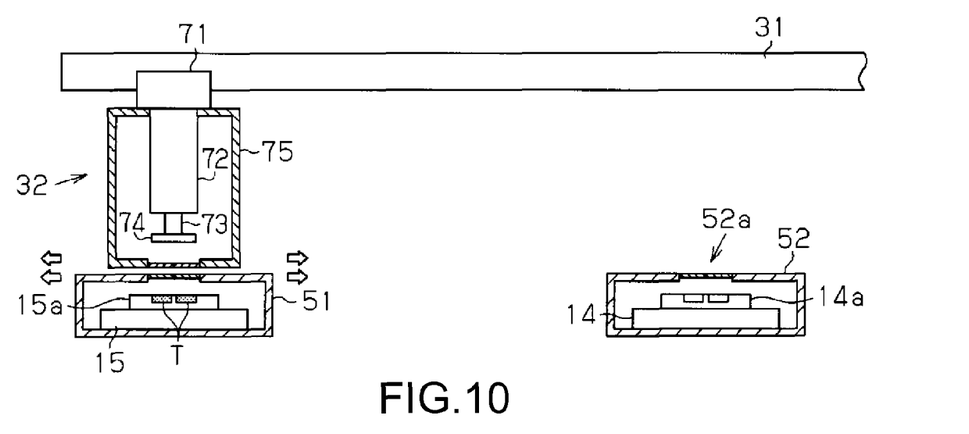
FIG. 10 is an action drawing illustrating a state of transfer of the device by the handler of the second embodiment.

First of all, as in the first embodiment described above, nitrogen gas is supplied from the cooling gas supply unit 61 to the flow channel in the first shuttle 15, and the supply shuttle plate 15a and the collecting shuttle plate 15b are cooled via the first shuttle 15. Also, the cooling gas discharged from the flow channel in the first shuttle 15 is heated to a normal temperature by the cooling gas heating unit 62, and the heated cooling gas is supplied into the first housing box 51. In the same manner as the first embodiment, nitrogen gas is supplied from the cooling gas supply unit into the flow channel in the test head 14, and the inspection socket 14a is cooled via the test head 14. Also, the cooling gas discharged from the flow channel in the test head 14 is heated to a normal temperature by the cooling gas heating unit, and the heated cooling gas is supplied into the inspection box 52.

A closing pressure is supplied to the arm opening-and-closing cylinder 91 of the first transfer unit 32 and the box opening-and-closing cylinder 92 of the first housing box 51, and the lid members 75b and 51a are closed. A closing pressure is also supplied to the opening-and-closing cylinder of the inspection box 52, and the lid member 52a is closed. Closing of the respective lid members 51a and 52a is performed after cooling gas heated by the respective boxes 51 and 52 has been supplied for a predetermined time and the boxes have been purged. Closing of the lid member 75b is performed in the same manner after dry air has been supplied to the arm box 75 for a predetermined time and the arm box 75 has been purged.

Subsequently, when the devices T are transferred from the supply shuttle plate 15a of the first shuttle 15 to the test head 14, as illustrated in FIG. 10, the first shuttle 15 is moved first of all in the X-direction, so that the supply shuttle plate 15a is positioned immediately under the transfer guide 31 as in the first embodiment described above. Also, the horizontal moving arm 71 moves in the Y-direction, so that the first transfer unit 32 is positioned immediately above the supply shuttle plate 15a.

Subsequently, the control unit 80 outputs a drive signal for driving the arm opening-and-closing cylinder 91 to the arm opening-and-closing cylinder driving unit 81e, and then the arm opening-and-closing cylinder driving unit 81e causes the arm opening-and-closing cylinder 91 to contract, whereby the lid member 75b is opened. The control unit 80 outputs a drive signal for driving the box opening-and-closing cylinder 92 to the box opening-and-closing cylinder 92, and then the box opening-and-closing cylinder driving unit 83a causes the box opening-and-closing cylinder 92 to contract in response to a drive signal, whereby the lid member 51a is opened.

At this time, outside air is hardly mixed in the interior of the arm box 75 in comparison with a case where the lid member 75b is continuously opened. Also, outside air is hardly mixed in the interior of the first housing box 51 in comparison with a case where the lid member 51a is continuously opened. Therefore, increase of the concentration of the dry air in the periphery of the devices T and increase of the concentration of the cooling gas heated in the respective spaces where the devices T are to be transferred are enabled in comparison with a configuration in which the lid members 51a and 75b are not provided. In addition, the pressures in the respective interiors of the arm box 75 and the first housing box 51 are increased by closing the lid members 51a and 75b in comparison with the case where the lid members 51a and 75b are continuously opened. Therefore, when the lid members 51a and 75b are respectively opened, the outside air may be restrained from being mixed in the respective interiors of the arm box 75 and the first housing box 51.

Figure 11:
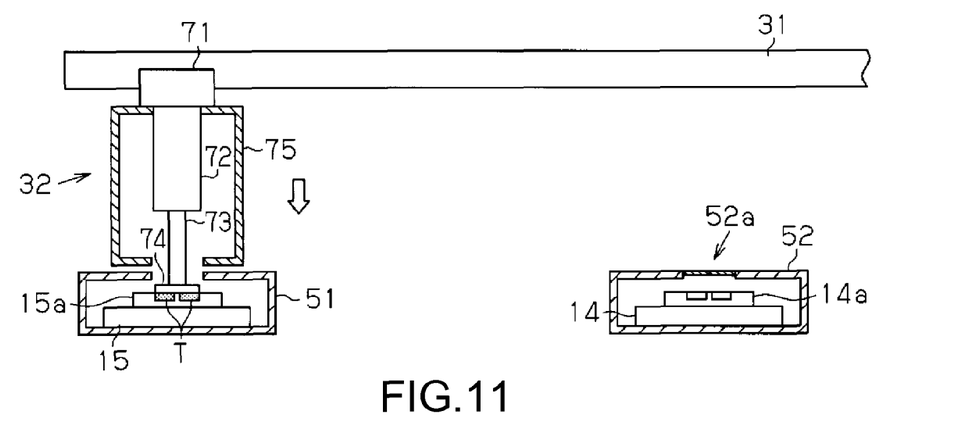
FIG. 11 is an action drawing illustrating the state of transfer of the device by the handler of the second embodiment.

Subsequently, as illustrated in FIG. 11, the vertical movement arm 73 moves downward, and the adsorbing portions 74 adsorb the devices T accommodated in the supply shuttle plate 15a thereon. Accordingly, the vertical movement arm 73 moves upward, and the devices T adsorbed on the adsorbing portions 74 are accommodated in the arm box 75.

Figure 12:
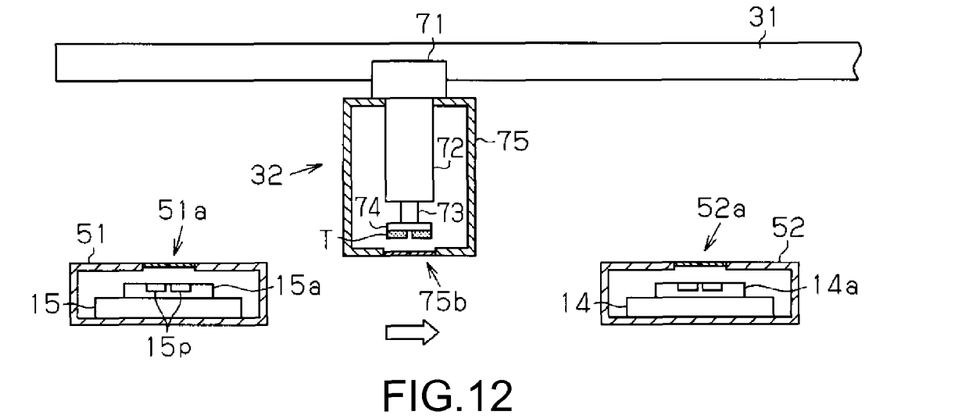
FIG. 12 is an action drawing illustrating the state of transfer of the device by the handler of the second embodiment.

Subsequently, the control unit 80 outputs a drive signal for driving the arm opening-and-closing cylinder 91 to the arm opening-and-closing cylinder driving unit 81e, and then the arm opening-and-closing cylinder driving unit 81e causes the arm opening-and-closing cylinder 91 to expand, whereby the lid member 75b is closed. The control unit 80 outputs a drive signal for driving the box opening-and-closing cylinder 92 to box opening-and-closing cylinder driving unit 83a, and then the box opening-and-closing cylinder driving unit 83a causes the box opening-and-closing cylinder 92 to expand, whereby the lid member 51a is closed. Subsequently, the horizontal moving arm 71 is moved in the Y-direction, whereby the first transfer unit 32 moves from immediately above the first shuttle 15 toward immediately above the test head 14 in a state in which the devices T are accommodated in the arm box 75 as illustrated in FIG. 12.

Figure 13:
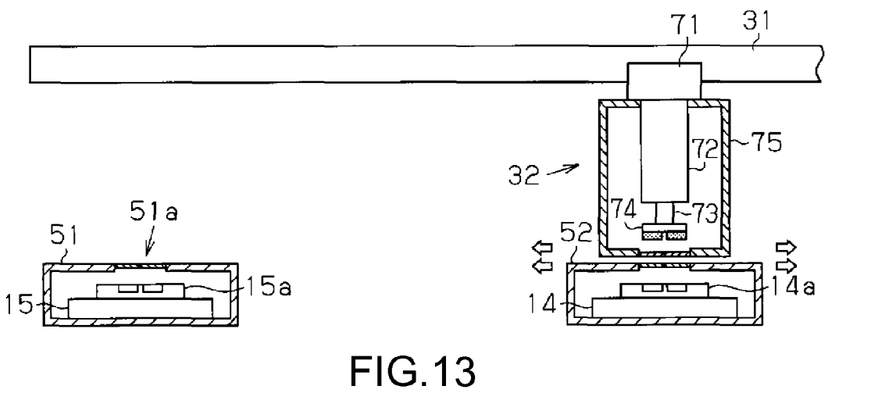
FIG. 13 is an action drawing illustrating the state of transfer of the device by the handler of the second embodiment.

Then, as illustrated in FIG. 13, the first transfer unit 32 is positioned immediately above the test head 14, and the lid member 75b of the arm box 75 and the lid member 52a of the inspection box 52 face each other. Subsequently, the control unit 80 outputs a drive signal for driving the arm opening-and-closing cylinder 91 to the arm opening-and-closing cylinder driving unit 81e, and then the arm opening-and-closing cylinder driving unit 81e causes the arm opening-and-closing cylinder 91 to contract, whereby the lid member 75b is opened. The control unit 80 outputs a drive signal for driving the box opening-and-closing cylinder 92 to the box opening-and-closing cylinder driving unit 83a, and then the box opening-and-closing cylinder driving unit 83a causes the box opening-and-closing cylinder 92 to contract, whereby the lid member 51a is opened.

Figure 14:
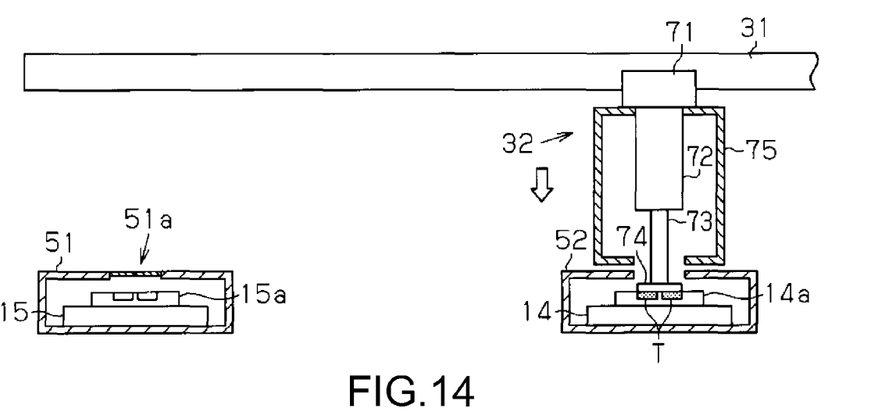
FIG. 14 is an action drawing illustrating the state of transfer of the device by the handler of the second embodiment.

Subsequently, as illustrated in FIG. 14, the vertical movement arm 73 moves downward, and the devices T adsorbed on the adsorbing portions 74 are pressed against the inspection socket 14a of the test head 14 at a predetermined pressing force. When the inspection of the devices T is terminated, the vertical movement arm 73 moves upward, and the devices T adsorbed on the adsorbing portions 74 are accommodated in the arm box 75.

Figure 15:
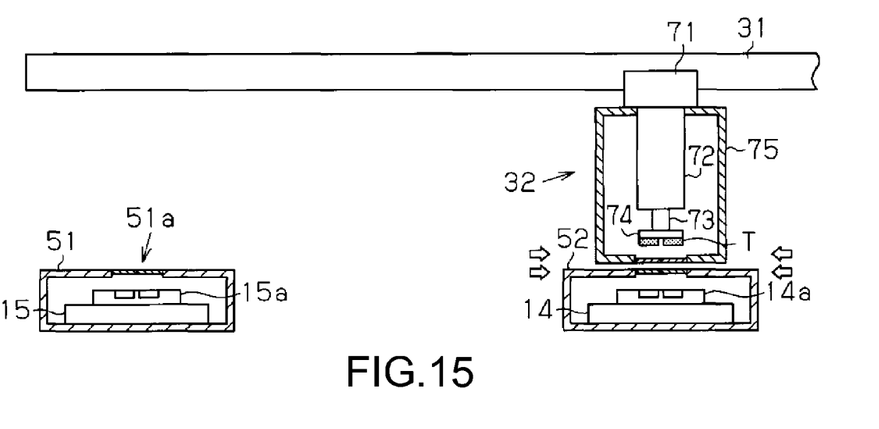
FIG. 15 is an action drawing illustrating the state of transfer of the device by the handler of the second embodiment.

Then, the control unit 80 generates and outputs a drive signal for driving the arm opening-and-closing cylinder 91 and the arm opening-and-closing cylinder driving unit 81e causes the arm opening-and-closing cylinder 91 to expand on the basis of the generated drive signal. Then, the control unit 80 generates and outputs a drive signal for driving the box opening-and-closing cylinder 92 and the box opening-and-closing cylinder driving unit 83a causes the box opening-and-closing cylinder 92 to contract on the basis of the generated drive signal. Accordingly, the lid members 75b and 51a are closed.

As described above, according to the part inspection apparatus and the handler of the second embodiment, the effects listed below are achieved in addition to the effects achieved by the first embodiment described above.

(6) The arm box 75 includes the lid member 75b configured to cover the opening 75h, the respective boxes 51 to 53 include lid members configured to cover the openings, and the lid members are opened when the adsorbing portions 74 pass through the openings. Therefore, in comparison with a case where the arm box 75 and the respective boxes 51 to 53 do not have the lid members, gases on the outside thereof may hardly be mixed into the interiors of the arm box 75 and the respective boxes 51 to 53. Therefore, since the interiors of the arm box 75 and the respective boxes 51 to 53 may easily be filled with dry air, dew condensation hardly occurs on the surfaces of the devices T accommodated within the arm box 75 and the respective boxes 51 to 53.

The first embodiment and the second embodiment described above may be implemented by modifying as described below as needed.

The period during which the devices T are accommodated in the arm box 75 may be the entire period when the devices T are transferred by the movement of the horizontal moving arm 71, or may be part of such period. What is essential is that the devices T are accommodated in the arm box 75 at least during part of the transfer period of the devices T.

The number of boxes where the cooling unit is accommodated may be one or two, or may be four or more. In comparison with the configuration in which such boxes are not provided, since one or more of the boxes are provided, dew condensation hardly occurs on the devices T correspondingly.

All of the first housing box 51, the inspection box 52, and the second housing box 53 may be omitted. In such a configuration, the effect equivalent to (1) described above can be obtained. The gas supply unit configured to supply the dry air may not be connected to the first housing box 51, the inspection box 52, and the second housing box 53. In such a configuration, the effect equivalent to (1) described above is achieved.

A supply unit configured to supply cooling gas and a supply unit configured to supply dry air may be provided separately. In such a configuration, the effects equivalent to (1), (2), (4), and (5) described above are achieved.

The cooling gas heating unit 62 may heat the cooling gas temperature to a temperature lower than the dew point in the outside air. In such a configuration as well, dew condensation on the surfaces of the devices T accommodated in the first housing box 51 and dew condensation on the outer surface of the first housing box 51 may be restrained in comparison with the case where the cooling gas is not heated.

A configuration in which the cooling gas heating unit 62 is omitted may be employed and, even in such a configuration, the effects equivalent to (1) to (3) and (5) described above are achieved.

In the second embodiment, the lid member 75b provided on the arm box 75 may be omitted, and part or all of the lid members provided on the respective boxes 51 to 53 may be omitted. In other words, in comparison with the configuration in which the lid member is not provided at all, as long as the configuration in which any one of the lid members is provided, the effect equivalent to (5) described above is achieved correspondingly.

Dry air may be supplied to the transfer space of the handler 10. In such a configuration, the dry air may be maintained in the interiors of the arm box 75 and the respective boxes 51 to 53 easily even when an atmosphere in the environment in which the part inspection apparatus is installed enters and the moisture in the interior of the part inspection apparatus is increased at the time of maintenance or the like of the handler 10 and the part inspection apparatus as long as the arm box 75 and the respective boxes 51 to 53 are provided. Therefore, occurrence of dew condensation on the surface of the devices T may be restrained.

If the dry air is maintained in the interiors of the arm box 75 and the respective boxes 51 to 53, the transfer of the devices T or the like may be performed, and hence dry air to be supplied for restoring the environment in the part inspection apparatus into the dried state is not necessary in comparison with the case where such a configuration is not provided, so that the amount of consumption of the dry air may be reduced correspondingly. Also, since the time for restoring the environment in the part inspection apparatus is not necessary, or only the time for restoring the environment in the interiors of the arm box 75 and the respective boxes 51 to 53 is necessary, an operation efficiency of the availability factor of the part inspection apparatus is enhanced.

For example, a configuration in which compressed air cooled by nitrogen gas is supplied to the first shuttle 15 may be employed for the cooling gas supply unit 61 in addition to the configuration in which nitrogen gas is supplied as gas for cooling the first shuttle 15.

The cooling gas heating unit 62 may have a configuration having a dryer configured to dry cooling gas in addition to a heat exchanger configured to heat cooling gas.

The dry air supplied into the arm box 75 is not limited to the compressed air, and may be nitrogen gas or the like.

The dry air supply unit 76 does not have to be connected to the arm box 75, and what is essential is that a dry air supply port of the dry air supply unit 76 is provided at a position where the dry air is supplied into the internal space of the arm box 75.

A supply pipe of the dry air supply unit 76 may have a configuration passing through the transfer robot 30.

The arm box 75 may be provide with a sensor configured to detect at least one of gas characteristics in the arm box 75, for example, temperature, relative moisture, absolute moisture, and pressure. The control unit 80 may be configured to adjust the flow rate of dry air to be supplied from the dry air supply unit 76 to the arm box 75 on the basis of a detected value that is detected by the sensor.

In this case, the air valve 77 mounted between the dry air supply unit 76 and the arm box 75 may be configured to function as a throttle valve that throttles the flow rate of the dry air to be supplied to the arm box 75 to a level equal to or lower than the predetermined flow rate by changing the opening degree thereof. Alternatively, in addition to the air valve 77, a throttle valve that throttles the flow rate of the dry air to be supplied to the arm box 75 to a level equal to or lower than a predetermined flow rate may be coupled between the dry air supply unit 76 and the arm box 75. A regulator configured to adjust the pressure of the dry air supplied to the arm box 75 to a predetermined range may be coupled between the dry air supply unit 76 and the arm box 75.

Furthermore, piping configured to supply dry air to the arm box 75 may be bifurcated into piping configured to supply dry air at a relatively high flow rate and piping configured to supply dry air at a relatively low flow rate. For example, the piping configured to supply dry air at a relatively high flow rate and the piping configured to supply dry air at a relatively low flow rate are connected in parallel to the arm box 75 and such a difference in flow rate may be adjusted by throttle valves to be coupled to the respective piping.

Furthermore, the piping configured to supply dry air to the arm box 75 may be bifurcated into piping configured to supply dry air at a relatively high pressure and piping configured to supply dry air at a relatively low pressure. For example, the piping configured to supply dry air at a relatively high pressure and the piping configured to supply dry air at a relatively low pressure are connected in parallel to the arm box 75 and such a difference in pressure may be adjusted by regulators to be coupled to the respective piping. For reference, the piping configured to supply dry air to the arm box 75 at a relatively high flow rate may be configured to serve also as the piping configured to supply dry air at a relatively high pressure, or the piping configured to supply dry air at a relatively low flow rate may be configured to serve also as the piping configured to supply the dry air at a relatively low pressure.

Then, the flow rate of the dry air supplied to the arm box 75 is controlled in the following manner on the basis of the detected value detected by the sensor mounted on the arm box 75.

For example, a reference temperature range in the arm box 75 is set to a temperature range which does not cause dew condensation in the arm box 75, and when the temperature in the arm box 75 is lower than the reference range, the control unit 80 increase the flow rate of dry air to be supplied from the dry air supply unit 76 to the arm box 75. In contrast, when the temperature in the arm box 75 exceeds the reference range, the control unit 80 decreases the flow rate of the dry air to be supplied from the dry air supply unit 76 to the arm box 75. When the temperature in the arm box 75 is decreased in the reference range, the control unit 80 increases the flow rate of the dry air to be supplied from the dry air supply unit 76 to the arm box 75. In contrast, when the temperature in the arm box 75 increases within the reference range, the control unit 80 decreases the flow rate of the dry air to be supplied from the dry air supply unit 76 to the arm box 75.

For example, a reference temperature range in the arm box 75 is set to a temperature range which does not cause any problem in adjustment of the temperature of the subsequent devices T, and when the temperature in the arm box 75 is lower than the reference range, the control unit 80 increases the flow rate of the dry air to be supplied from the dry air supply unit 76 to the arm box 75. In contrast, when the temperature in the arm box 75 exceeds the reference range, the control unit 80 decreases the flow rate of the dry air to be supplied from the dry air supply unit 76 to the arm box 75. When the temperature in the arm box 75 is decreased within the reference range, the control unit 80 increases the flow rate of the dry air to be supplied from the dry air supply unit 76 to the arm box 75. In contrast, when the temperature in the arm box 75 increases within the reference range, the control unit 80 decreases the flow rate of the dry air to be supplied from the dry air supply unit 76 to the arm box 75.

For example, a reference moisture range in the arm box 75 is set to a relative moisture range or an absolute moisture range which does not cause dew condensation in the arm box 75, and when the relative moisture or the absolute moisture in the arm box 75 is lower than the reference range, the control unit 80 decreases the flow rate of the dry air to be supplied from the dry air supply unit 76 to the arm box 75. In contrast, when the moisture in the arm box 75 exceeds the reference range, the control unit 80 increases the flow rate of the dry air to be supplied from the dry air supply unit 76 to the arm box 75. When the relative moisture or the absolute moisture in the arm box 75 is decreased within the reference range, the control unit 80 decreases the flow rate of the dry air to be supplied from the dry air supply unit 76 to the arm box 75. In contrast, when the moisture in the arm box 75 increases within the reference range, the control unit 80 increases the flow rate of the dry air to be supplied from the dry air supply unit 76 to the arm box 75.

For example, a reference pressure range in the arm box 75 is set to a range of the pressure in the arm box 75 in which the flow rate of the outside air entering into the arm box 75 is the level which does not affect the temperature control of the devices T. Then, when the pressure in the arm box 75 is lower than the reference range, the control unit 80 increases the flow rate of the dry air to be supplied from the dry air supply unit 76 to the arm box 75. In contrast, when the pressure in the arm box 75 exceeds the reference range, the control unit 80 decreases the flow rate of the dry air to be supplied from the dry air supply unit 76 to the arm box 75. When the pressure in the arm box 75 is decreased within the reference range, the control unit 80 increases the flow rate of the dry air to be supplied from the dry air supply unit 76 to the arm box 75. In contrast, when the pressure in the arm box 75 increases within the reference range, the control unit 80 decreases the flow rate of the dry air to be supplied from the dry air supply unit 76 to the arm box 75.

For example, the flow rate of dry air to be supplied may be relatively increased until the detected value of the sensor reaches the reference range, and may be relatively decreased when the detected value has reached the reference range. Switching of the flow rate of the dry air to be supplied may be performed on the basis of elapsed time from the start.

Adjustment of the flow rate of dry air to be supplied to the arm box 75 in the above-described modification may be performed on the basis of two or more of the above-described characteristics, namely, temperature, relative moisture, absolute moisture, and pressure.

Accordingly, the effects described below may be achieved.

(7) The arm box 75 may be provided with a sensor configured to detect at least one of temperature, relative moisture, absolute moisture, and pressure therein. The control unit 80 changes the flow rate of the dry air to be supplied from the dry air supply unit 76 to the arm box 75 on the basis of the result of detection of the sensor. Therefore, in comparison with the configuration in which such a sensor is not provided, at least one of temperature, relative moisture, absolute moisture, and pressure in the arm box 75 at the time of detection by the sensor is reflected on the flow rate of the dry air to be supplied into the arm box 75. Therefore, at least one of temperature, relative moisture, absolute moisture, and pressure in the arm box 75 may easily be maintained in a predetermined range. As a result, the interior of the arm box 75 may easily be maintained in an environment which does not cause dew condensation on the surfaces of the devices T. The interior of the arm box 75 may easily be maintained in an environment suitable for controlling the temperature of the devices T.

(8) When the pressure difference between the interior and the exterior of the arm box 75 exceeds a reference range, increase of the temperature of the devices T due to the increase in pressure in the arm box 75 for reducing the flow rate of dry air is restrained. In contrast, with the configuration in which the pressure control is not performed, it is necessary to restrain the increase in temperature of the devices T by relatively reducing the temperature of dry air to enter the arm box 75. In other words, in comparison with such a configuration, application of a load in control of the temperature of the devices T by the pressure in the arm box 75 is restrained with the configuration described above.

In contrast, when the pressure difference between the interior and the exterior of the arm box 75 is lower than the reference range, decrease in the temperature of the devices T due to the decrease in pressure in the arm box 75 for increasing the flow rate of dry air is restrained. Therefore, in comparison with the configuration in which such pressure control is not performed, application of a load in control of the temperature of the devices T by the pressure in the arm box 75 is restrained. In addition, by restraining the entry of the outside air into the arm box 75, increase in the moisture in the arm box 75 is restrained.

Each of the first housing box 51, the inspection box 52, and the second housing box 53 may be provided with a sensor configured to detect at least one of temperature, relative moisture, absolute moisture, and pressure in the respective boxes 51 to 53 in the same manner as the arm box 75. In this case as well, what is essential is that the flow rate of gas supplied from the cooling gas heating unit 62 is adjusted in the same mode as described above. The sensor or the throttle valve may be provided on all of the above-described respective boxes 51 to 53 or may be provided on one or two of them. In this configuration, the same effects as the effects in the above-described arm box 75 may be achieved in the respective boxes 51 to 53.

Although the lid member 75*b* of the arm box 75 and the lid members of the respective boxes 51 to 53 are configured to have two plate members in the second embodiment. However, a configuration in which the opening is covered with a single plate member is also applicable. Although the lid member 75*b* of the arm box 75 and the lid members of the respective boxes 51 to 53 are configured to be driven by a working pressure from the opening-and-closing cylinder, a configuration being driven by other actuators may also be applicable. What is essential is that members configured to cover the opening 75*h* formed in the arm box 75 and the openings formed in the respective boxes 51 to 53 are provided, and that a configuration which achieves a state of allowing passage of the adsorbing portions 74 and a state of prohibiting passage of the adsorbing portions 74 by opening and closing the lid members by driving these members is provided as a lid member.

A configuration in which when the first transfer unit 32 is positioned immediately above the first housing box 51, the relative position of the arm box 75 with respect to the supporting portion 72 is moved to the side of the first housing box 51, so that the lower surface of the arm box 75 and the upper surface of the first housing box 51 come into contact with each other is also applicable. Also, a configuration in which when the first transfer unit 32 is positioned immediately above the first housing box 51, the length of the arm box 75 in the Z-direction is expanded, so that the lower surface of the arm box 75 and the upper surface of the first housing box 51 come into contact with each other is also applicable. Accordingly, the arm box 75 and the first housing box 51 are connected, that is, the internal spaces of the respective boxes are connected via the opening 75*h* of the arm box 75 and the opening 51*h* of the first housing box 51. Therefore, the devices T are further restrained from coming into contact with the gas on the outsides of the arm box 75 and the first housing box 51 and hence dew condensation occurring on the surface of the devices T is further restrained.

The length of the arm box 75 in the Z-direction and the length of the first housing box 51 in the Z-direction may be a length which brings the lower surface of the arm box 75 and the upper surface of the first housing box 51 into contact with each other when the first transfer unit 32 is positioned immediately above the first housing box 51. Accordingly, since the arm box 75 and the first housing box 51 are connected, the devices T are further restrained from coming into contact with the gas on the outsides of the arm box 75 and the first housing box 51 and hence dew condensation occurring on the surface of the devices T is further restrained.

The arm box 75 may not be formed with the opening 75*h*, and a configuration in which the arm box itself opens and closes to accommodate the adsorbing portions 74 and the devices T in the interior thereof, and take out the same from the interior thereof is also applicable.

The respective boxes 51 to 53 may not be formed with the openings, and a configuration in which the respective boxes 51 to 53 themselves open and close to accommodate the adsorbing portions 74 and the devices T in the interiors thereof, and take out the same from the interiors thereof is also applicable.

The adsorbing portions 74 may be mounted at positions other than the lower end of the vertical movement arm 73.

The handler 10 may have a configuration provided with an arm configured to move downward toward the shuttle plates 15*a*, 15*b*, 16*a*, and 16*b* and the inspection socket 14*a* which constitute the placing portion and an arm configured to move upward from the placing portion separately.

The arm box 75 may not have the vertical movement arm 73 accommodated therein as long as at least the adsorbing portions 74 and the devices T are accommodated.

The transfer units 32 and 33 may each have a holding portion configured to hold the devices T by a method other than the vacuum adsorption as a holding portion configured to hold the devices T.

The object to be transferred by the handler 10 and the object to be inspected by the part inspection apparatus are not limited to the devices T described above, and any object to be transferred may be used as long as it can be transferred by the handler 10. The inspection to be performed by the part inspection apparatus is not limited to the inspection of the electrical characteristics described above, and inspections suitable for an object to be transferred are applicable.

The entire disclosure of Japanese Patent Application No. 2012-029764, filed Feb. 14, 2012 is expressly incorporated by reference herein.

What is claimed is:
1. A part inspection apparatus comprising:
a placing portion on which an object to be transferred is placed and on which the object to be transferred is cooled;
a transfer robot configured to transfer the object from the placing portion; and
a tester configured to inspect the object to be transferred, wherein
the transfer robot includes:
a holding portion configured to hold the object to be transferred placed on the placing portion;
an arm configured to move the holding portion away from the placing portion;

a housing member configured to accommodate the holding portion together with the object to be transferred in a state of being kept away from the placing portion; and a dry gas supply unit configured to supply dry gas into the housing member, wherein the housing member is a first housing member, the dry gas supply unit is a first dry gas supply unit, a second housing member as a housing member is configured to accommodate the placing portion, and a second dry gas supply unit is configured to supply dry gas into the second housing member.

2. The part inspection apparatus according to claim 1, wherein the first housing member and the second housing member are connected.

3. A handler comprising:

a placing portion on which an object to be transferred is placed and on which the object to be transferred is cooled; and a transfer robot configured to transfer the object from the placing portion, wherein the transfer robot includes:

a holding portion configured to hold the object to be transferred placed on the placing portion;

an arm configured to move the holding portion away from the placing portion;

a housing member configured to accommodate the holding portion together with the object to be transferred in a state of being kept away from the placing portion; and a dry gas supply unit configured to supply dry gas into the housing member, wherein the housing member is a first housing member, the dry gas supply unit is a first dry gas supply unit, a second housing member as a housing member is configured to accommodate the placing portion, and a second dry gas supply unit is configured to supply dry gas into the second housing member.

4. The handler according to claim 3, wherein the placing portion includes a flow channel where a cooling medium flows, and the second dry gas supply unit supplies the cooling medium discharged from the flow channel of the placing portion to the second housing member as the dry gas.

5. The handler according to claim 4, wherein the second dry gas supply unit includes a dry gas heating unit configured to heat the cooling medium discharged from the flow channel of the placing portion.

6. The handler according to claim 3, wherein the first housing member and the second housing member each include an opening configured to allow passage of the holding portion and the object to be transferred held by the holding portion.

7. The handler according to claim 6, wherein the opening of the first housing member is a first opening, the opening of the second housing member is a second opening, the first housing member has a first lid member configured to cover the first opening, the second housing member has a second lid member configured to cover the second opening, the first lid member is opened when the holding portion passes through the first opening, and the second lid member is opened when the holding portion passes through the second opening.

8. The handler according to claim 3, wherein a sensor configured to detect characteristics of gas in the first housing member is provided, and the flow amount of the dry gas supplied from the first dry gas supply unit to the first housing member is changed on the basis of the result of detection of the sensor.

* * * * *